(12) United States Patent
Sorabji et al.

(10) Patent No.: US 8,111,978 B2
(45) Date of Patent: Feb. 7, 2012

(54) RAPID THERMAL PROCESSING CHAMBER WITH SHOWER HEAD

(75) Inventors: Khurshed Sorabji, San Jose, CA (US); Joseph Michael Ranish, San Jose, CA (US); Wolfgang Aderhold, Cupertino, CA (US); Aaron Muir Hunter, Santa Cruz, CA (US); Alexander N. Lerner, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 864 days.

(21) Appl. No.: 12/171,994

(22) Filed: Jul. 11, 2008

(65) Prior Publication Data

US 2010/0008656 A1    Jan. 14, 2010

(51) Int. Cl.
*A21B 2/00* (2006.01)
(52) U.S. Cl. ......................................... 392/416
(58) Field of Classification Search .................. 392/416
See application file for complete search history.

(56) References Cited

U.S. PATENT DOCUMENTS

| | | | |
|---|---|---|---|
| 5,399,523 A | 3/1995 | Kakoschke |
| 5,508,532 A | 4/1996 | Teramoto |
| 5,530,265 A | 6/1996 | Takemura |
| 5,595,606 A | 1/1997 | Fujikawa et al. |
| 5,648,277 A | 7/1997 | Zhang |
| 5,660,472 A | 8/1997 | Peuse et al. |
| 5,712,495 A | 1/1998 | Suzawa |
| 5,719,065 A | 2/1998 | Takemura et al. |
| 5,755,511 A | 5/1998 | Peuse et al. |
| 5,892,236 A | 4/1999 | Takahashi et al. |
| 5,937,142 A | 8/1999 | Moslehi et al. |
| 5,945,711 A | 8/1999 | Takemura et al. |
| 6,001,756 A | 12/1999 | Takahashi et al. |
| 6,013,236 A | 1/2000 | Takahashi et al. |
| 6,075,922 A | 6/2000 | Tay et al. |
| 6,087,245 A | 7/2000 | Yamazaki et al. |
| 6,090,733 A | 7/2000 | Otsuki et al. |
| 6,133,550 A | 10/2000 | Griffiths et al. |
| 6,156,628 A | 12/2000 | Ohnuma et al. |
| 6,187,704 B1 | 2/2001 | Takahashi et al. |
| 6,188,044 B1 | 2/2001 | Lee et al. |
| 6,200,388 B1 | 3/2001 | Jennings |
| 6,214,755 B1 | 4/2001 | Otsuki et al. |

(Continued)

FOREIGN PATENT DOCUMENTS

EP    0821085 A1    1/1998

(Continued)

OTHER PUBLICATIONS

PCT International Search Report and Written Opinion mailed Jan. 21, 2010, PCT/US09/50085, 10 pgs.

(Continued)

*Primary Examiner* — Daniel L Robinson
(74) *Attorney, Agent, or Firm* — Diehl Servilla LLC

(57) ABSTRACT

Apparatus and methods for thermally processing a substrate are provided. A chamber containing a levitating support assembly configured to position the substrate at different distances from a plate during the heating and cooling of a substrate. In one embodiment a plurality of openings on the surface of the plate are configured to evenly distribute gas across a radial surface of the substrate. The distribution of gas may couple radiant energy not reflected back to the substrate during thermal processing with an absorptive region of the plate to begin the cooling of the substrate. The method and apparatus provided within allows for a controllable and effective means for thermally processing a substrate rapidly.

24 Claims, 4 Drawing Sheets

U.S. PATENT DOCUMENTS

| | | | |
|---|---|---|---|
| 6,215,106 | B1 | 4/2001 | Boas et al. |
| 6,217,969 | B1 | 4/2001 | Takahashi et al. |
| 6,261,370 | B1 | 7/2001 | Otsuki et al. |
| 6,303,411 | B1 | 10/2001 | Camm et al. |
| 6,350,964 | B1 | 2/2002 | Boas et al. |
| 6,375,348 | B1 | 4/2002 | Hebb et al. |
| 6,375,752 | B1 | 4/2002 | Otsuki et al. |
| 6,376,804 | B1 | 4/2002 | Ranish et al. |
| 6,393,210 | B1 | 5/2002 | Wu |
| 6,406,179 | B2 | 6/2002 | Adams et al. |
| 6,429,104 | B1 | 8/2002 | Auberton-Herve |
| 6,466,426 | B1 | 10/2002 | Mok et al. |
| 6,468,879 | B1 | 10/2002 | Lamure et al. |
| 6,471,913 | B1 | 10/2002 | Weaver et al. |
| 6,476,362 | B1 | 11/2002 | Deacon et al. |
| 6,478,937 | B2 | 11/2002 | Olgado et al. |
| 6,500,266 | B1 | 12/2002 | Ho et al. |
| 6,534,752 | B2 | 3/2003 | Camm et al. |
| 6,570,134 | B2 | 5/2003 | Suzuki et al. |
| 6,570,137 | B1 | 5/2003 | Jennings |
| 6,576,065 | B1 | 6/2003 | Lamure |
| 6,599,818 | B2 | 7/2003 | Dairiki |
| 6,723,202 | B2 | 4/2004 | Nagaiwa et al. |
| 6,787,739 | B2 | 9/2004 | Lee et al. |
| 6,794,275 | B2 | 9/2004 | Kondo et al. |
| 6,800,833 | B2 | 10/2004 | Gregor et al. |
| 6,839,507 | B2 | 1/2005 | Adams et al. |
| 6,853,802 | B2 | 2/2005 | Neyret et al. |
| 6,868,302 | B2 | 3/2005 | Kobayashi et al. |
| 6,897,131 | B2 | 5/2005 | Ramachandran et al. |
| 6,908,540 | B2 | 6/2005 | Kholodenko |
| 6,919,271 | B2 | 7/2005 | Gat |
| 6,927,169 | B2 | 8/2005 | Maydan et al. |
| 6,929,744 | B2 | 8/2005 | Le |
| 6,962,732 | B2 | 11/2005 | Won et al. |
| 7,024,105 | B2 | 4/2006 | Fodor et al. |
| 7,127,367 | B2 | 10/2006 | Ramachandran et al. |
| 7,226,488 | B2 | 6/2007 | Gat |
| 2001/0017294 | A1 | 8/2001 | Aoki et al. |
| 2002/0042192 | A1 | 4/2002 | Tanaka et al. |
| 2003/0000647 | A1 | 1/2003 | Yudovsky et al. |
| 2003/0015141 | A1 | 1/2003 | Takagi |
| 2004/0065657 | A1 | 4/2004 | Adams et al. |
| 2006/0066193 | A1 | 3/2006 | Ranish et al. |
| 2006/0289433 | A1 | 12/2006 | Timans |
| 2007/0077355 | A1 | 4/2007 | Chacin et al. |
| 2007/0104470 | A1 | 5/2007 | Aderhold et al. |

FOREIGN PATENT DOCUMENTS

| | | |
|---|---|---|
| EP | 1933368 A2 | 6/2008 |
| WO | WO-2005/093353 A1 | 10/2005 |

OTHER PUBLICATIONS

Extended European Search Report for PCT/US2009/050085, mailed Oct. 5, 2011, pp. 1-8.

RAPID THERMAL PROCESSING CHAMBER WITH SHOWER HEAD

BACKGROUND

Embodiments of the invention relate generally to heat treatment of semiconductor wafers and other substrates. In particular, embodiments of the invention relate to rapid thermal processing of wafers from a radiant source, such as an array of incandescent lamps.

The fabrication of integrated circuits from silicon or other wafers involves many steps of depositing layers, photo lithographically patterning the layers, and etching the patterned layers. Ion implantation is used to dope active regions in the semiconductive silicon. The fabrication sequence also includes thermal annealing of the wafers for many uses including curing implant damage and activating the dopants, crystallization, thermal oxidation and nitridation, silicidation, chemical vapor deposition, vapor phase doping, thermal cleaning, and other reasons. Although annealing in early stages of silicon technology typically involved heating multiple wafers for long periods in an annealing oven, rapid thermal processing, (RTP) has been increasingly used to satisfy the ever more stringent requirements for ever smaller circuit features. RTP is typically performed in single-wafer chambers by irradiating a wafer with light from an array of high-intensity lamps directed at the front face of the wafer on which the integrated circuits are being formed. The radiation is at least partially absorbed by the wafer and quickly heats it to a desired high temperature, for example above 600° C., or in some applications, above 1000° C. The radiant heating can be quickly turned on and off to controllably and uniformly heat the wafer over a relatively short period, for example, of a minute or less, or even a few seconds. RTP chambers are capable of uniformly heating a wafer at rates of about 50° C./second and higher, for example, at rates of 100°-150° C./second, and 200°-400° C./second. Typical ramp-down (cooling) rates in RTP chambers are in the range of 80-150° C./second. Some processes performed in RTP chambers require variations in temperature across the substrate of less than a few degrees Celsius.

Since rapid thermal processing works on a single semiconductor each time, optimal heating and cooling means are necessary for optimal RTP performance. It is desirable to optimize substrate temperature uniformity during thermal processing of the substrate. Temperature uniformity provides uniform process variables on the substrate (e.g. layer thickness, resistivity, etch depth) for temperature activated steps such as film deposition, oxide growth and etching. In addition, substrate temperature uniformity is necessary to prevent thermal stress-induced substrate damage such as warpage, defect generation and slip. For example, at 1150° C., a center to edge temperature difference on a four-inch silicon wafer of approximately 5° C. can induce dislocation formation and slip. Temperature gradients may also be induced by other sources. For example, a substrate may have non-uniform emissivity because of spatial modifications to surface areas or volumes of the substrate. These modifications may include films that have been patterned by photolithography or locally doped regions, such as buried layers for bipolar transistors. In addition, substrate temperature gradients may be induced by localized gas cooling or heating effects related to processing chamber design as well as non-uniform endothermic or exothermic reactions that may occur on the substrate surface during processing. It would be desirable to provide RTP chambers that provide improved temperature uniformity.

SUMMARY

One or more embodiments of the invention are directed to a rapid thermal processing (RTP) apparatus for heating a substrate. The RTP chamber may comprise a chamber and a support for holding the substrate in the chamber, the substrate having a first face and a second face opposite the first face. A radiant heat source which directs radiant energy towards the first face of the substrate may be inside the chamber. The radiant heat source can be configured to be quickly turned on and off to controllably heat the substrate with a desired spatial temperature distribution, including a uniform distribution. The apparatus further includes at least one pyrometer for measuring the intensity of radiation over a predetermined wavelength range. The pyrometer may be positioned to receive radiation emitted by the substrate. The apparatus may also include a plate which faces the second face of the substrate. The plate includes at least one gas channel coupled to at least one gas source and to a plurality of openings on a surface of the plate. The openings are configured to evenly distribute process gases over the substrate. The plate has reflective regions that reflect radiation within the predetermined wavelength range.

In other embodiments, the plate may be positioned in close proximity to the substrate. The plate of these embodiments may absorb at least a portion of radiation emitted by the wafer. In further embodiments, the plate extends over an area greater than that of the substrate.

In one or more embodiments, the gas channels are configured to deliver a first gas and a second gas. The first and second gases may be mixed in at least one mixing chamber within the gas channels before being delivered. Additional configurations may allow for more than two gases to be delivered simultaneously. The gases may also be reactive, and can be mixed before or after delivery to the substrate surface.

In further embodiments, the plate has an outer, highly reflective portion, and an inner portion having an absorptive layer underlying the outer portion. The reflective regions of the plate can be positioned to reflect heat toward the at least one pyrometer.

The openings of some embodiments are configured to evenly distribute gas across a radial surface of the substrate to promote thermal coupling of the plate to the substrate. In other embodiments, the openings are distributed evenly across the plate.

Some embodiments have a support for mounting the substrate being a levitating support assembly. The levitating assembly can be configured to move the substrate between an upper position and lower position within the chamber. The levitating support assembly can also be magnetically coupled to a stator assembly. The stator assembly can be further mechanically coupled to an actuator assembly.

In one or more embodiments, the substrate can be positioned at various distances from the plate during the heating a cooling processes. This may allow for custom tailoring the gas flow field between the plate and the substrate. The distance can be changed dynamically, thereby modulating the residence times of active species to affect the substrate surface chemistry.

Additional embodiments of the invention are directed toward methods for rapidly thermally processing a substrate. The method may include rapidly heating the substrate by directing a radiant heat source to a first surface of the substrate; reflecting the radiant heat towards a second surface of the substrate with a reflective body positioned proximate to a second surface the substrate; cooling the substrate by absorbing heat through an absorptive plate; and directing a process gas through the absorptive plate to the second surface of the substrate.

The heating of the substrate in some embodiments comprises a time period of about 2 minutes or less. The cooling of the substrate in other embodiments may be done in a time period of about 10 seconds or less. In one or more embodiments, the substrate is positioned below and proximate the plate for cooling. In other embodiments, the substrate is positioned above the plate.

Further embodiments direct the process gas through a plurality of openings on a surface of the absorptive plate. The openings may be positioned to evenly distribute gas across the radial surface of the substrate to enhance thermal conduction between the substrate and an absorptive layer of the absorptive plate during cooling. The openings may also be positioned to distribute gas across the radial surface of the substrate in a controlled uneven distribution.

The rapid thermal processing technique of various embodiments comprises a spike annealing process to form a film on the substrate. substrate.

DETAILED DESCRIPTION

The embodiments described below are generally directed to an RTP system including a plate incorporating gas distribution outlets to distribute gas evenly over a substrate to allow rapid and controlled heating and cooling of the substrate. The plate may be absorptive, reflective, or a combination of both. As used herein, rapid thermal processing or RTP refers an apparatus or a process capable of uniformly heating a wafer at rates of about 50° C./second and higher, for example, at rates of 100 to 150° C./second, and 200 to 400° C./second. Typical ramp-down (cooling) rates in RTP chambers are in the range of 80-150° C./second. Some processes performed in RTP chambers require variations in temperature across the substrate of less than a few degrees Celsius. Thus, an RTP chamber must include a lamp or other suitable heating system and heating system control capable of heating at rates of up to 100 to 150° C./second, and 200 to 400° C./second distinguishing rapid thermal processing chambers from other types of thermal chambers that do not have a heating system and heating control system capable of rapidly heating at these rates. In the embodiment shown, the RTP chamber optionally includes a substrate support that is adapted to levitate and rotate within the chamber without any contact with the inside walls of the chamber. The levitating substrate support system, coupled with the absorptive plate incorporating gas distribution outlets, enables the flow from the absorptive plate to be tailored to enhance heating and cooling of the substrate being processed in the chamber. By providing the ability to modulate the distance between the absorptive plate with the gas distribution outlets, the residence time of active species can be changed and the substrate surface chemistry can be more accurately changed.

Figure 1:
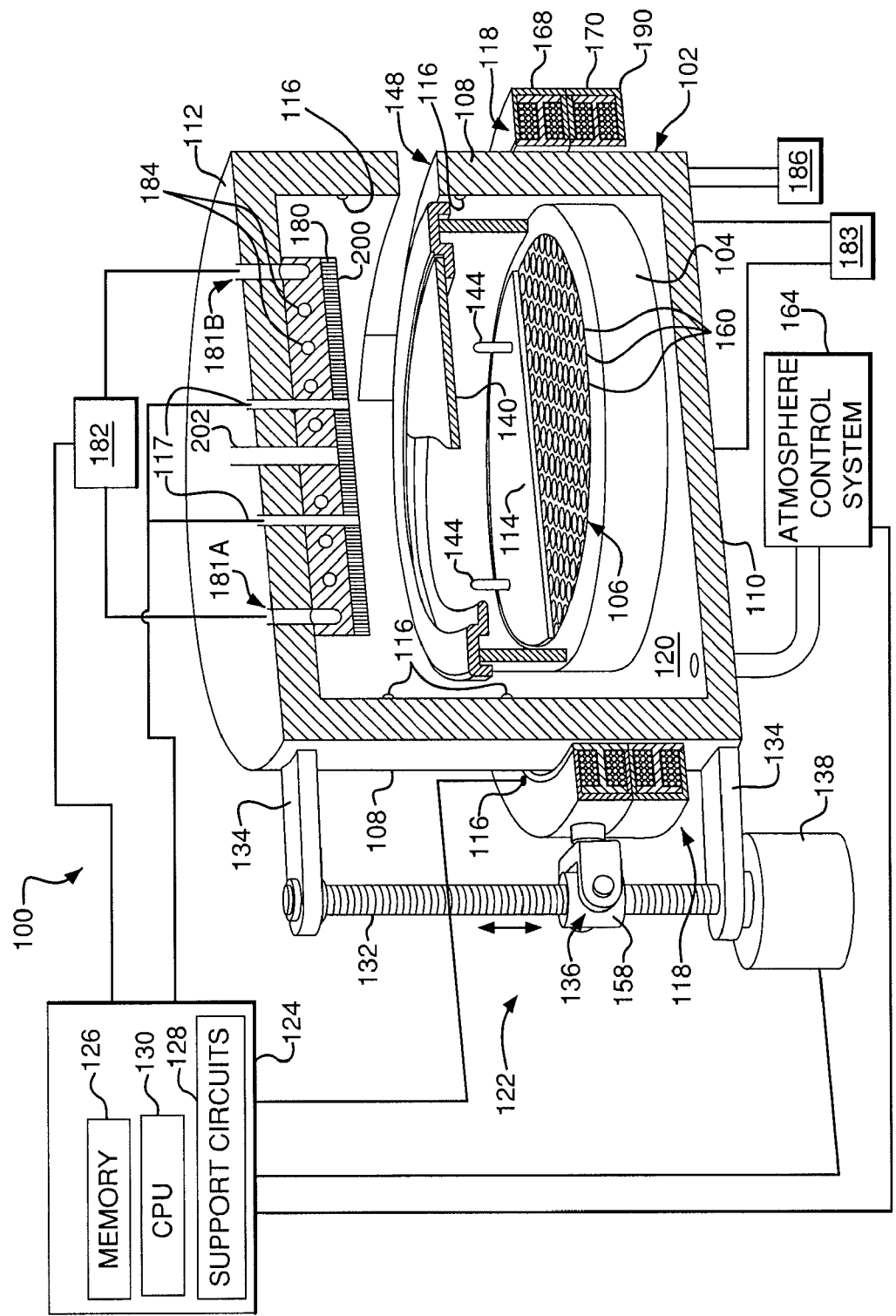
FIG. 1 is a simplified isometric view of an embodiment of a rapid thermal processing (RTP) chamber.

Referring now to FIG. 1, an exemplary embodiment of a rapid thermal processing chamber 100 is shown. The processing chamber 100 includes a substrate support 104, a chamber body 102, having walls 108, a bottom 110, and a top 112 defining an interior volume 120. The walls 108 typically include at least one substrate access port 148 to facilitate entry and egress of a substrate 140 (a portion of which is shown in FIG. 1). The access port may be coupled to a transfer chamber (not shown) or a load lock chamber (not shown) and may be selectively sealed with a valve, such as a slit valve (not shown). In one embodiment, the substrate support 104 is annular and the chamber 100 includes a radiant heat source 106 disposed in an inside diameter of the substrate support 104. The radiant heat source 106 typically comprises a plurality of lamps. Examples of an RTP chamber that may be modified and a substrate support that may be used is described in U.S. Pat. No. 6,800,833 and United States Patent Application Publication No. 2005/0191044, both of which are incorporated by reference in their entireties. In one embodiment of the invention, the chamber 100 includes a plate 200 incorporating gas distribution outlets (described in more detail below) to distribute gas evenly over a substrate to allow rapid and controlled heating and cooling of the substrate.

The plate may be absorptive, reflective, or have a combination of absorptive and reflective regions. In a detailed embodiment, the plate may have regions, some within view of the pyrometers, some outside the view of the pyrometers. The regions within view of the pyrometers may be about one inch in diameter, if circular, or other shape and size as necessary. The regions within view of the probes may be very highly reflective over the wavelength ranges observed by the pyrometers. Outside the pyrometer wavelength range and field of view, the plate can range from reflective to minimize radiative heat loss, to absorptive to maximize radiative heat loss to allow for shorter thermal exposure.

The RTP chamber 100 also includes a cooling block 180 adjacent to, coupled to, or formed in the top 112. Generally, the cooling block 180 is spaced apart and opposing the radiant heat source 106. The cooling block 180 comprises one or more coolant channels 184 coupled to an inlet 181A and an outlet 181B. The cooling block 180 may be made of a process resistant material, such as stainless steel, aluminum, a polymer, or a ceramic material. The coolant channels 184 may comprise a spiral pattern, a rectangular pattern, a circular pattern, or combinations thereof and the channels 184 may be formed integrally within the cooling block 180, for example by casting the cooling block 180 and/or fabricating the cooling block 180 from two or more pieces and joining the pieces. Additionally or alternatively, the coolant channels 184 may be drilled into the cooling block 180.

The inlet 181A and outlet 181B may be coupled to a coolant source 182 by valves and suitable plumbing and the coolant source 182 is in communication with the controller 124 to facilitate control of pressure and/or flow of a fluid disposed therein. The fluid may be water, ethylene glycol, nitrogen ($N_2$), helium (He), or other fluid used as a heat-exchange medium.

In the embodiment shown, the substrate support 104 is optionally adapted to magnetically levitate and rotate within the interior volume 120. The substrate support 104 shown is capable of rotating while raising and lowering vertically during processing, and may also be raised or lowered without rotation before, during, or after processing. This magnetic levitation and/or magnetic rotation prevents or minimizes particle generation due to the absence or reduction of moving parts typically required to raise/lower and/or rotate the substrate support.

The chamber 100 also includes a window 114 made from a material transparent to heat and light of various wavelengths, which may include light in the infra-red (IR) spectrum, through which photons from the radiant heat source 106 may heat the substrate 140. In one embodiment, the window 114 is made of a quartz material, although other materials that are transparent to light maybe used, such as sapphire. The window 114 may also include a plurality of lift pins 144 coupled to an upper surface of the window 114, which are adapted to selectively contact and support the substrate 140, to facilitate transfer of the substrate into and out of the chamber 100. Each of the plurality of lift pins 144 are configured to minimize absorption of energy from the radiant heat source 106 and may be made from the same material used for the window 114, such as a quartz material. The plurality of lift pins 144 may be positioned and radially spaced from each other to facilitate passage of an end effector coupled to a transfer robot (not shown). Alternatively, the end effector and/or robot may be capable of horizontal and vertical movement to facilitate transfer of the substrate 140.

In one embodiment, the radiant heat source 106 includes a lamp assembly formed from a housing which includes a plurality of honeycomb tubes 160 in a coolant assembly (not shown) coupled to a second coolant source 183. The second coolant source 183 may be one or a combination of water, ethylene glycol, nitrogen ($N_2$), and helium (He). The housing walls 108, 110 may be made of a copper material or other suitable material having suitable coolant channels formed therein for flow of the coolant from the second coolant source 183. The coolant cools the housing of the chamber 100 so that the housing is cooler than the substrate 140. Each tube 160 may contain a reflector and a high-intensity lamp assembly or an IR emitter from which is formed a honeycomb like pipe arrangement. This close-packed hexagonal arrangement of pipes provides radiant energy sources with high power density and good spatial resolution. In one embodiment, the radiant heat source 106 provides sufficient radiant energy to thermally process the substrate, for example, annealing a silicon layer disposed on the substrate 140. The radiant heat source 106 may further comprise annular zones, wherein the voltage supplied to the plurality of tubes 160 by controller 124 may varied to enhance the radial distribution of energy from the tubes 160. Dynamic control of the heating of the substrate 140 may be effected by the one or more temperature sensors 117 adapted to measure the temperature across the substrate 140.

In the embodiment shown, an optional stator assembly 118 circumscribes the walls 108 of the chamber body 102 and is coupled to one or more actuator assemblies 122 that control the elevation of the stator assembly 118 along the exterior of the chamber body 102. In one embodiment (not shown), the chamber 100 includes three actuator assemblies 122 disposed radially about the chamber body, for example, at about 120° angles about the chamber body 102. The stator assembly 118 is magnetically coupled to the substrate support 104 disposed within the interior volume 120 of the chamber body 102. The substrate support 104 may comprise or include a magnetic portion to function as a rotor, thus creating a magnetic bearing assembly to lift and/or rotate the substrate support 104. In one embodiment, at least a portion of the substrate support 104 is partially surrounded by a trough (not shown) that is coupled to a fluid source 186, which may include water, ethylene glycol, nitrogen ($N_2$), helium (He), or combinations thereof, adapted as a heat exchange medium for the substrate support.

The stator assembly 118 may also include a housing 190 to enclose various parts and components of the stator assembly 118. In one embodiment, the stator assembly 118 includes a drive coil assembly 168 stacked on a suspension coil assembly 170. The drive coil assembly 168 is adapted to rotate and/or raise/lower the substrate support 104 while the suspension coil assembly 170 may be adapted to passively center the substrate support 104 within the processing chamber 100. Alternatively, the rotational and centering functions may be performed by a stator having a single coil assembly.

An atmosphere control system 164 is also coupled to the interior volume 120 of the chamber body 102. The atmosphere control system 164 generally includes throttle valves and vacuum pumps for controlling chamber pressure. The atmosphere control system 164 may additionally include gas sources for providing process or other gases to the interior volume 120. The atmosphere control system 164 may also be adapted to deliver process gases for thermal deposition processes, thermal etch processes, and in-situ cleaning of chamber components. The atmosphere control system works in conjunction with the showerhead gas delivery system.

The chamber 100 also includes a controller 124, which generally includes a central processing unit (CPU) 130, support circuits 128 and memory 126. The CPU 130 may be one of any form of computer processor that can be used in an industrial setting for controlling various actions and subprocessors. The memory 126, or computer-readable medium, may be one or more of readily available memory such as random access memory (RAM), read only memory (ROM), floppy disk, hard disk, or any other form of digital storage, local or remote, and is typically coupled to the CPU 130. The support circuits 128 are coupled to the CPU 130 for supporting the controller 124 in a conventional manner. These circuits include cache, power supplies, clock circuits, input/output circuitry, subsystems, and the like.

In one embodiment, each of the actuator assemblies 122 generally comprise a precision lead screw 132 coupled between two flanges 134 extending from the walls 108 of the chamber body 102. The lead screw 132 has a nut 158 that axially travels along the lead screw 132 as the screw rotates. A coupling 136 is coupled between the stator 118 and nut 158 so that as the lead screw 132 is rotated, the coupling 136 is moved along the lead screw 132 to control the elevation of the stator 118 at the interface with the coupling 136. Thus, as the lead screw 132 of one of the actuators 122 is rotated to produce relative displacement between the nuts 158 of the other actuators 122, the horizontal plane of the stator 118 changes relative to a central axis of the chamber body 102.

In one embodiment, a motor 138, such as a stepper or servo motor, is coupled to the lead screw 132 to provide controllable rotation in response to a signal by the controller 124. Alternatively, other types of actuators 122 may be utilized to control the linear position of the stator 118, such as pneumatic cylinders, hydraulic cylinders, ball screws, solenoids, linear actuators and cam followers, among others.

The chamber 100 also includes one or more sensors 116, which are generally adapted to detect the elevation of the substrate support 104 (or substrate 140) within the interior volume 120 of the chamber body 102. The sensors 116 may be coupled to the chamber body 102 and/or other portions of the processing chamber 100 and are adapted to provide an output indicative of the distance between the substrate support 104 and the top 112 and/or bottom 110 of the chamber body 102, and may also detect misalignment of the substrate support 104 and/or substrate 140.

The one or more sensors 116 are coupled to the controller 124 that receives the output metric from the sensors 116 and provides a signal or signals to the one or more actuator assemblies 122 to raise or lower at least a portion of the substrate support 104. The controller 124 may utilize a positional metric obtained from the sensors 116 to adjust the elevation of the stator 118 at each actuator assembly 122 so that both the elevation and the planarity of the substrate support 104 and substrate 140 seated thereon may be adjusted relative to and a central axis of the RTP chamber 100 and/or the radiant heat source 106. For example, the controller 124 may provide signals to raise the substrate support by action of one actuator 122 to correct axial misalignment of the substrate support 104, or the controller may provide a signal to all actuators 122 to facilitate simultaneous vertical movement of the substrate support 104.

The one or more sensors 116 may be ultrasonic, laser, inductive, capacitive, or other type of sensor capable of detecting the proximity of the substrate support 104 within the chamber body 102. The sensors 116, may be coupled to the chamber body 102 proximate the top 112 or coupled to the walls 108, although other locations within and around the chamber body 102 may be suitable, such as coupled to the stator 118 outside of the chamber 100. In one embodiment, one or more sensors 116 may be coupled to the stator 118 and are adapted to sense the elevation and/or position of the substrate support 104 (or substrate 140) through the walls 108. In this embodiment, the walls 108 may include a thinner cross-section to facilitate positional sensing through the walls 108.

The chamber 100 also includes one or more temperature sensors 117, which may be adapted to sense temperature of the substrate 140 before, during, and after processing. In the embodiment depicted in FIG. 1, the temperature sensors 117 are disposed through the top 112, although other locations within and around the chamber body 102 may be used. The temperature sensors 117 may be optical pyrometers, as an example, pyrometers having fiber optic probes. The sensors 117 may be adapted to couple to the top 112 in a configuration to sense the entire diameter of the substrate, or a portion of the substrate. The sensors 117 may comprise a pattern defining a sensing area substantially equal to the diameter of the substrate, or a sensing area substantially equal to the radius of the substrate. For example, a plurality of sensors 117 may be coupled to the top 112 in a radial or linear configuration to enable a sensing area across the radius or diameter of the substrate. In one embodiment (not shown), a plurality of sensors 117 may be disposed in a line extending radially from about the center of the top 112 to a peripheral portion of the top 112. In this manner, the radius of the substrate may be monitored by the sensors 117, which will enable sensing of the diameter of the substrate during rotation.

As described herein, the chamber 100 is adapted to receive a substrate in a "face-up" orientation, wherein the deposit receiving side or face of the substrate is oriented toward the plate 200 and the "backside" of the substrate is facing the radiant heat source 106. The "face-up" orientation may allow the energy from the radiant heat source 106 to be absorbed more rapidly by the substrate 140 as the backside of the substrate is typically less reflective than the face of the substrate.

Although the plate 200 and radiant heat source 106 is described as being positioned in an upper and lower portion of the interior volume 120, respectively, the position of the cooling block 180 and the radiant heat source 106 may be reversed. For example, the cooling block 180 may be sized and configured to be positioned within the inside diameter of the substrate support 104, and the radiant heat source 106 may be coupled to the top 112. In this arrangement, the quartz window 114 may be disposed between the radiant heat source 106 and the substrate support 104, such as adjacent the radiant heat source 106 in the upper portion of the chamber 100. Although the substrate 140 may absorb heat readily when the backside is facing the radiant heat-source 106, the substrate 140 could be oriented in a face-up orientation or a face down orientation in either configuration.

Figure 2:
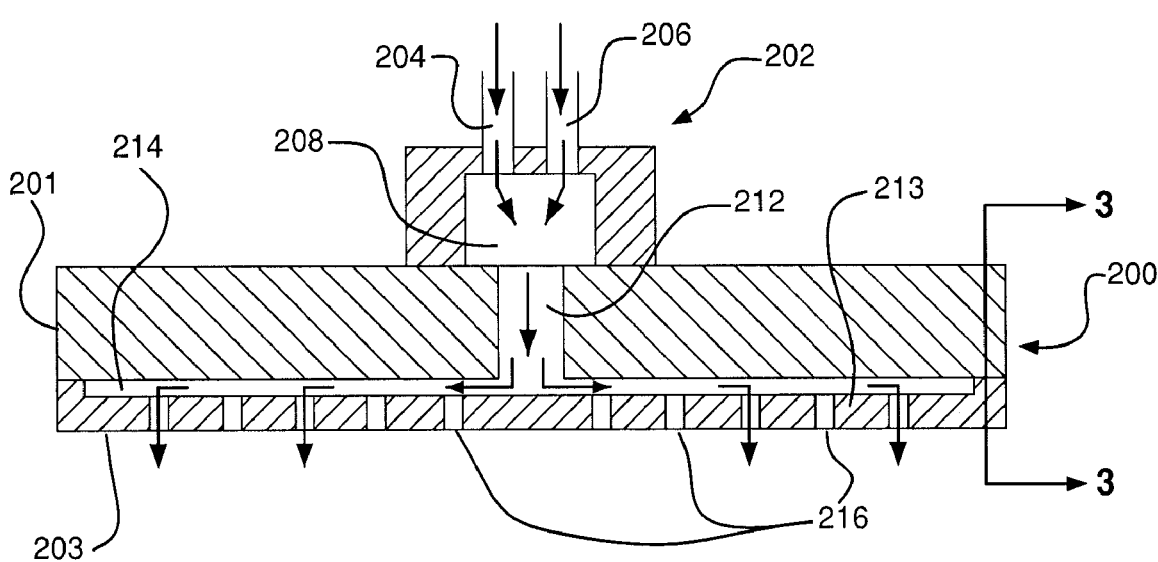
FIG. 2 is a cross-sectional view of a substrate positioned proximate an absorptive shower head according to an embodiment.
Figure 3:
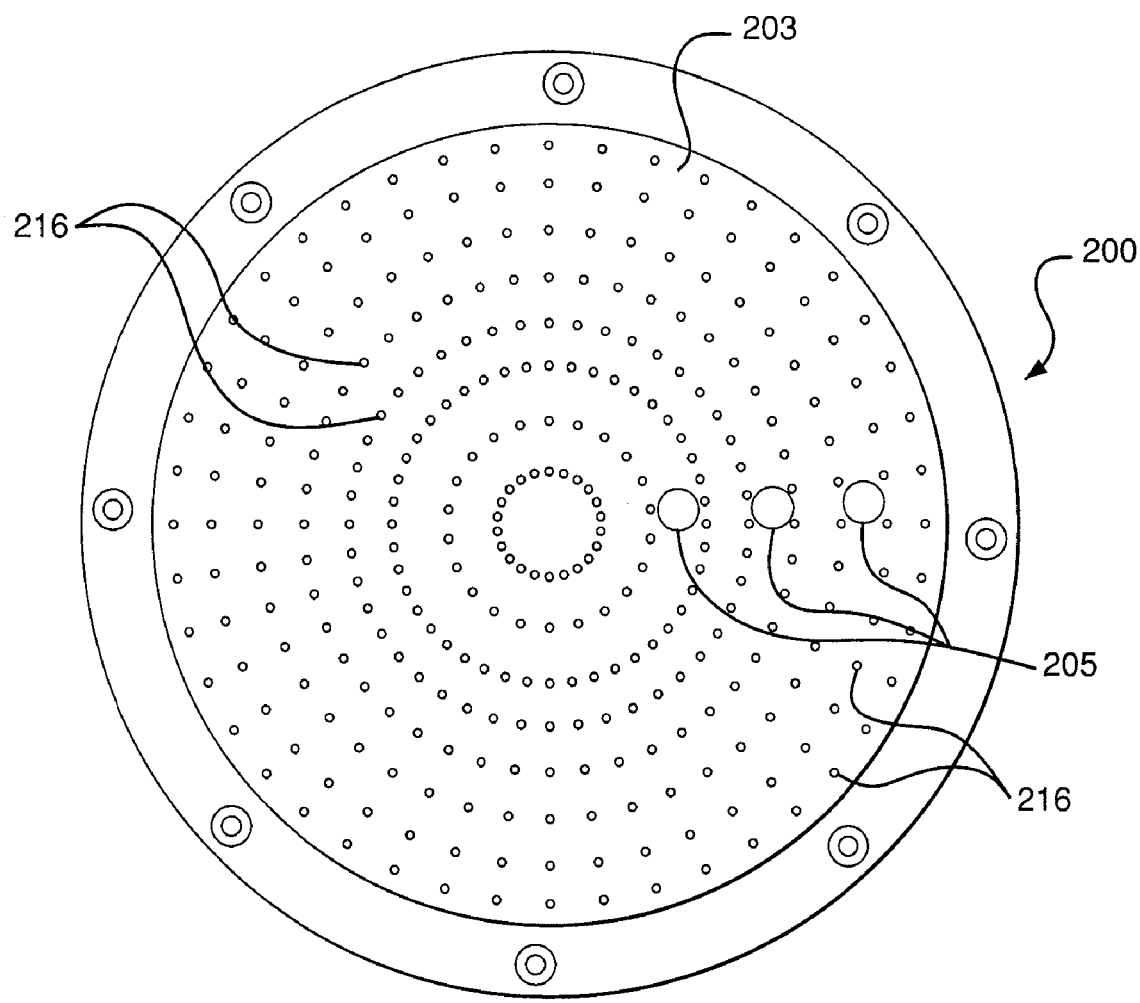
FIG. 3 is a bottom plan view of the absorptive shower head.

Further details on an absorptive plate 200 are shown in FIGS. 2 and 3. Referring to FIG. 2, an absorptive plate 200 incorporating gas distribution outlets to distribute gas evenly over a substrate to allow rapid and controlled heating and cooling of the substrate is shown. The plate 200 includes a top portion 201 having a gas introduction system 202, includes a first gas introduction port 204 and an optional second gas introduction port 206 in communication with a gas mixing chamber 208 for mixing gases the two gases. If only a single gas introduction port is provided, mixing chamber 208 can be eliminated from the design. It will be understood that additional gas introduction ports can be provided as well. The gas introduction ports 202, 204 would of course be connected to a suitable gas source such as a tank of gas or gas supply system (not shown). Mixing chamber 208 is in communication with gas flow passage 212, which is in communication with gas channel 214 and gas introduction openings 216 formed in blocker plate 213. The blocker plate 213 may be a separate component fastened to the top portion 201, or it may be integrally formed with the top portion. Of course, other designs are possible, including ones where two or more sets of individual openings of the type 216 are provided for two or more gases so that gas mixing takes place after exiting the showerhead. The absorptive plate includes a face 203 through which openings 216 are formed.

FIG. 3 shows a plan view of an absorptive plate 200 and the plurality of openings 216 through face 203. It will be understood that the number of and pattern of openings can be varied and the design shown in FIG. 3 is exemplary only. For ease of illustration, bores through the plate 200 to allow the temperature sensors 117 to measure the temperature of the substrate. In one or more embodiments, the plurality of openings on the absorptive plate comprise of no more than 10% of the plate's surface. In one embodiment the plurality of openings are positioned no closer than within a 25 mm of the pyrometers and within a 1 in diameter of the highly reflective surface of the absorptive plate.

In one or more embodiments, in a system for processing silicon substrates, a pyrometer that detects long radiation wavelengths (e.g., wavelengths greater than about 3.5 to 4 microns) is utilized as the temperature sensor 117. However, this approach is best suited for temperatures above 700° C. At room temperature, a silicon wafer is transparent to wavelengths of light longer than 1.0 microns. As the temperature of the substrate increases, the substrate becomes opaque to the longer wavelengths until, at about 700° C., the substrate becomes opaque to all wavelengths of interest. Thus, at temperatures below 700° C., a long wavelength sensitive pyrometer will be more apt to also detect light coming directly from the heat source. In short, the wavelength sampled by the pyrometer will typically vary with the process temperature. If the process temperature is substantially below 700° C., then the pyrometer will typically sample wavelengths shorter than 1.1 microns. If higher process temperatures are used, then longer wavelengths can be sampled.

In one design, particularly suitable for process temperatures between 900° C. and 1350° C., a solid-state pyrometer is used that is sensitive to radiation at wavelengths between 0.9 microns and 1.0 microns. In this temperature range, there is substantial amount of radiation produced in the wavelength range 0.9-1.0 microns providing high signal strengths and high signal-to-noise ratios.

Figure 4:
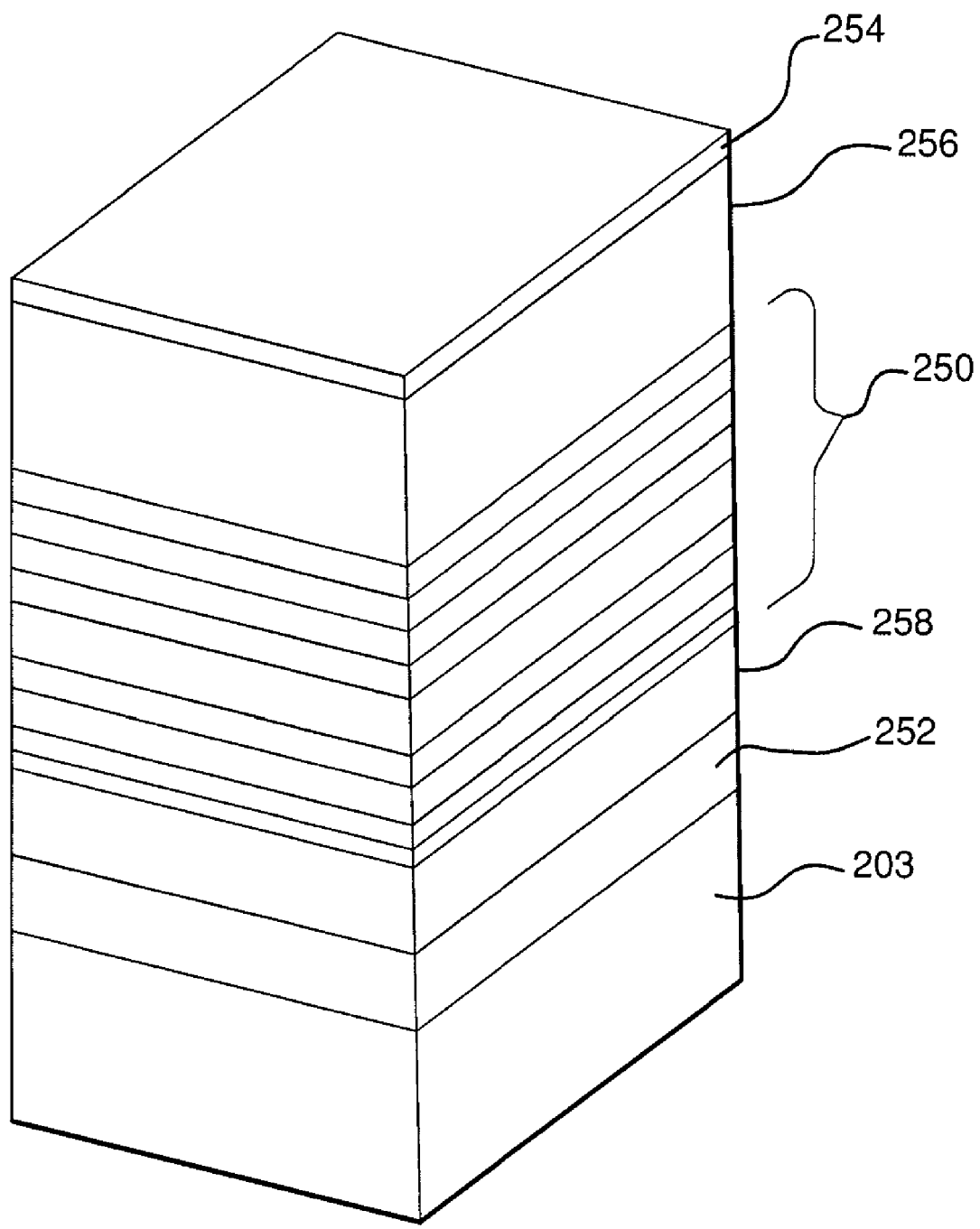
FIG. 4 is a cross-sectional view taken along line 3-3 in FIG. 2.

FIG. 4 shows a layering arrangement that may be used on the absorptive plate 200. As shown in FIG. 4, the face 203 of the absorptive plate 200 that faces the substrate 140 during processing has a layer that is highly reflective of radiation in a target wavelength range and less reflective of radiation outside the target wavelength range. In some embodiments, one or more coatings or layers are provided on the absorptive plate surface to achieve this selective reflectivity. In one embodiment, these coatings provide high reflectivity for radiation in the target wavelength range, and include one or more interference layers positioned over the surface of the absorptive plate.

As shown in FIG. 3, one or more interference layers 250 are included in the layer structure. The interference layers contain pairs of layers, each pair comprising a layer with a low index of refraction and a layer with a high index of refraction. Together, the interference layers comprise a structure that is highly reflective of radiation in the target wavelength range and less reflective of radiation outside the target wavelength range. The particular material, thickness, and other characteristics of the interference layers are selected based on a number of characteristics of the processing system, including the target wavelength range desired. A suitable interference layer structure may be obtained from Research Electro-Optics, Inc, of Boulder, Colo.

In one embodiment, a highly reflective portion of an absorptive plate 200 comprises a quarter-wave stack. The quarter-wave stack is made up of alternating dielectric layers which have different indices of refraction and have optical thickness equal to ¼ of the wavelength to which the pyrometer is most sensitive over the respective angles of acceptance into the pyrometer (e.g., a thickness equal to ¼ of 950 nanometers). As noted above, the interference layers 250 provide high reflectivity for radiation in the target wavelength Another portion of the absorptive plate 200 absorbs radiation outside the target wavelength. In one embodiment, an absorptive layer 252 can be positioned above the absorptive plate's face 203 and below the interference layers 250. This absorptive layer 250 is more absorptive than the high reflectivity portion of the absorptive plate 200. As radiation outside the target wavelength passes through the interference layers, it is absorbed by the absorptive layers. The resultant heat passes through the absorptive plate 200 and is dissipated through the cooling mechanism described above.

Various materials may be employed for the absorbing layer 252 including, for example, metal oxides, and suitable materials will be apparent to those of skill in the art. Moreover, other mechanisms for absorption of radiation may also be employed. For example, rather than employing an absorbing layer 252 as shown in FIG. 4, the absorptive plate face 203 may absorb radiation that passes through the highly reflective portion of absorptive plate. Likewise, the structure of the interference layers 250 shown in FIG. 4 is merely exemplary; other mechanisms known in the art may be used to filter, mirror, or reflect radiation in the target wavelength range away from the absorbing portion of the absorptive plate 200.

As shown in FIG. 4, a passivation layer 254 may be employed above the interference layers 250. This passivation layer prevents the material of the layers above the absorptive plate face 203 from possibly contaminating the chamber. The passivation layer 254 may be made of silicon dioxide, aluminum oxide, silicon nitride, or any other acceptable material that will passivate the reflector without unacceptably degrading its reflective properties in the wavelength range of interest.

Other layers 256, 258 may be employed on the reflector surface within the scope of the present invention to perform well-known functions for the fabrication or operation of the device. For example, such layers 256, 258 may be employed to facilitate application of, or transition between, the absorbing layer 252, the interference layers 250, and/or the passivation layer 254.

Generally the target wavelength range corresponds to the spectral region that is used for the pyrometric temperature measurement. In one embodiment, the pyrometric temperature measurement is an optical measurement of the radiation emitted by the substrate within a narrow spectral region. This spectral region is preferably approximately between 700 and 1000 nanometers. Similarly, the wavelength of radiation to be absorbed can also be identified. The spectrum of the radiated energy from a substrate during thermal processing is a complicated function of temperature, emissivity, and Planck's blackbody law. In simplified terms, the spectral limits of the absorbing portion of the reflector are determined by the blackbody law and the temperature range of the peak temperature of the process, i.e., the temperature of the process where radiative cooling is most desired.

In a detailed embodiment, shown in FIG. 3, an absorptive plate 200 has regions 205 of about one inch in diameter on each of the probes through which the temperature sensors, which are typically pyrometers, can measure the intensity of radiation over a predetermined wavelength region. The regions 205 have very high reflectivity over the pyrometer wavelength range, which may be in the form of a multi-layer dielectric stack over a specular surface in the regions 205 The main importance of these regions is that they provide a local region where there is significant enhancement of the apparent emissivity of the wafer in the region as viewed by the pyrometer.

In the embodiment shown in FIG. 1, the separation between the substrate and the plate 200 is dependent on the desired thermal exposure for the given substrate. In one embodiment, the substrate can be disposed at a greater distance from the plate 200 and closer to the lamps to increase the amount of thermal exposure of the substrate and to decrease the cooling from the plate. When the substrate is placed at position closer to the plate 200 and further from the lamps, this configuration decreases the amount of thermal exposure of the substrate and increases the cooling received from the plate. The exact position of the substrate during the heating of the substrate and the residence time spent in a specific position is conditional on the desired amount of thermal exposure and amount of cooling. In most cases, the residence time is dependent on the desired surface chemistry of the substrate. The embodiment shown in FIG. 1 allows the substrate support to be easily levitated at different vertical positions inside the chamber to permit control of the substrate's thermal exposure.

In an alternative embodiment, the absorptive plate and light source are inverted from the configuration shown in FIG. 1. In the inverted configuration, when the substrate is proximate the absorptive plate, the thermal conduction from the substrate to the absorptive plate 200 will increase and enhance the cooling process. The increased rate of cooling in turn can promote optimal RTP performance. Thus, when the substrate is positioned closer to the absorptive plate, the amount of thermal exposure to the lamps decreases while the amount of cooling from the plate increases.

In one embodiment, as the substrate is moved into a position proximate an absorptive plate, a gas can be released from a plurality of openings found on the surface of the absorptive plate to optimize cooling of the substrate. The plurality of openings may be configured to evenly distribute the gas across the radial surface of the substrate to enhance thermal conduction and convection between the substrate and the absorptive layer of the absorptive plate. To enhance the conductive effects, a more conductive gas may replace a less conductive gas, or the velocity of gas passing through holes 216 could be increased, creating turbulence and enhancing convective coupling between the showerhead and the substrate. Distributing gas radially towards the substrate optimizes cooling of the substrate and optimizes spike performance of the RTP chamber. In some embodiments, the substrate support can rotate the substrate to promote even distribution of gas over the substrate during processing for better uniformity.

A method from thermally processing a substrate inside a RTP chamber involves positioning a substrate at a desired distance from the absorptive plate. The substrate can be easily moved to positions that are ideal for heating and cooling the substrate as set forth by the specifications for thermal processing. The substrate moves at different distances from the absorptive plate by utilizing the levitating support assembly described above. In one embodiment, the support assembly can be controlled by a CPU attached to the RTP chamber.

In another embodiment, a different set of gases can be utilized during thermal processing. One set of gases are used during the heating of the substrate and a second set of gases are used during the cooling of the substrate. The selections of gases are dependent on the desired thermal conductivity. For example, using a low conductivity gas during thermal processing will decrease the amount of energy required during the ramp while using a gas of high thermal conductivity at the end of the process will increase the cool down rate.

Accordingly, one or more embodiments of the invention are directed to a rapid thermal processing (RTP) apparatus for heating a substrate. The RTP chamber may comprise a chamber and a support for holding the substrate in the chamber, the substrate having a first face and a second face opposite the first face. A radiant heat source which directs radiant energy towards the first face of the substrate may be inside the chamber. The radiant heat source can be configured to be quickly turned on and off to controllably heat the substrate with a desired spatial temperature distribution, including a uniform distribution. The apparatus further includes at least one pyrometer for measuring the intensity of radiation over a predetermined wavelength range. The pyrometer may be positioned to receive radiation emitted by the substrate. The apparatus might also include a plate which faces the second face of the substrate. The plate includes at least one gas channel coupled to at least one gas source and to a plurality of openings on a surface of the plate. The openings are configured to evenly distribute process gases over the substrate. The plate has reflective regions that reflect radiation within the predetermined wavelength range.

In other embodiments, the plate may be positioned in close proximity to the substrate. The plate of these embodiments may absorb at least a portion of radiation emitted by the wafer. In further embodiments, the plate extends over an area greater than that of the substrate.

The gas channels of various embodiments are configured to deliver a first gas and a second gas. The first and second gases may be mixed in at least one mixing chamber within the gas channels before being delivered. Additional configurations may allow for more than two gases to be delivered simultaneously. The gases may also be reactive, and can be mixed before or after delivery to the substrate surface. "Reactive gases" refer to gases that may be used for a reaction on the substrate such as an etching gas, or gases that are precursors that are used to form a material on the substrate.

In further embodiments, the plate has an outer, highly reflective portion, and an inner portion having an absorptive layer underlying the outer portion. The reflective regions of the plate can be positioned to reflect heat toward the at least one pyrometer.

The openings of some embodiments are configured to evenly distribute gas across a radial surface of the substrate to promote thermal coupling of the plate to the substrate. In other embodiments, the openings are distributed evenly across the plate.

Some embodiments have a support for mounting the substrate being a levitating support assembly. The levitating assembly can be configured to move the substrate between an upper position and lower position within the chamber. The levitating support assembly can also be magnetically coupled to a stator assembly. The stator assembly can be further mechanically coupled to an actuator assembly.

In one or more embodiments, the substrate can be positioned at various distances from the plate during the heating and/or cooling processes. This may allow for custom tailoring the gas flow field between the plate and the substrate. The distance can be changed dynamically, thereby modulating the residence times of active species to affect the substrate surface chemistry.

Additional embodiments of the invention are directed toward methods for rapidly thermally processing a substrate. The method may include rapidly heating the substrate by directing a radiant heat source to a first surface of the substrate; reflecting the radiant heat towards a second surface of the substrate with a reflective body positioned proximate to a second surface the substrate; cooling the substrate by absorbing heat through an absorptive plate; and directing a process gas through the absorptive plate to the second surface of the substrate.

The heating of the substrate in some embodiments comprises a time period of about 2 minutes or less. The cooling of the substrate in other embodiments may be done in a time period of about 10 seconds or less.

The substrate of various embodiments is positioned below and proximate the absorptive plate for cooling.

Further embodiments direct the process gas through a plurality of openings on a surface of the absorptive plate. The openings may be positioned to evenly distribute gas across the radial surface of the substrate to enhance thermal conduction between the substrate and an absorptive layer of the absorptive plate during cooling. The openings may also be positioned to distribute gas across the radial surface of the substrate in a controlled uneven distribution.

The rapid thermal processing technique of various embodiments comprises a spike annealing process to form a film on the substrate. substrate.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A rapid thermal processing apparatus for heating a substrate, comprising:
   a chamber;
   a support for holding the substrate in the chamber, the substrate having a first face and a second face opposite the first face;
   a radiant heat source directing radiant energy towards the first face of the substrate and configured to be quickly turned on and off to controllably heat the substrate with a desired spatial temperature distribution, including a uniform distribution;
   at least one pyrometer for measuring the intensity of radiation over a predetermined wavelength range, the pyrometer being positioned to receive radiation emitted by the substrate; and
   a plate facing the second face of the substrate, the plate including at least one gas channel coupled to at least one gas source and to a plurality of openings on a surface of the plate configured to evenly distribute process gases over the substrate, the plate having reflective regions that reflect radiation within the predetermined wavelength range.

2. The apparatus of claim 1, wherein the plate is positioned in close proximity to the substrate and the plate absorbs at least a portion of radiation emitted by the wafer.

3. The apparatus of claim 1, wherein the plate extends over an area greater than that of the substrate.

4. The apparatus of claim 1, wherein the gas channels are configured to deliver a first gas and a second gas.

5. The apparatus of claim 4, wherein the first gas and the second gas are mixed in at least one mixing chamber within the gas channels.

6. The apparatus of claim 4, wherein at least one of the first and second the gases are reactive.

7. The apparatus of claim 1, wherein the plate has an outer, highly reflective portion, and an inner portion having an absorptive layer underlying said outer portion.

8. The apparatus of claim 7, wherein the openings that are configured to evenly distribute gas across a radial surface of the substrate promote thermal coupling of the plate to the substrate.

9. The apparatus of claim 1, wherein the openings are distributed evenly across the plate.

10. The apparatus of claim 1, wherein the support for mounting the substrate is a levitating support assembly configured to move the substrate between an upper position and lower position within the chamber.

11. The apparatus of claim 10, wherein the levitating support assembly is magnetically coupled to a stator assembly.

12. The apparatus of claim 11, wherein the stator assembly is mechanically coupled to an actuator assembly.

13. The apparatus of claim 1, wherein the reflective regions of the plate are positioned to reflect heat toward at least one pyrometer.

14. A method for thermally processing a substrate rapidly, comprising:
    rapidly heating the substrate by directing a radiant heat source to a first surface of the substrate;
    reflecting the radiant heat towards a second surface of the substrate with a reflective body positioned proximate to a second surface the substrate;
    cooling the substrate by absorbing heat through an absorptive plate; and
    directing a process gas through the absorptive plate to the second surface of the substrate.

15. The method of claim 14, wherein the substrate is supported by a levitating and rotating substrate support positioned in a chamber.

16. The method of claim 14, wherein the substrate is disposed above and proximate a radiant heat source.

17. The method of claim 16, wherein the substrate and the absorptive plate are separated by different distances during heating and cooling.

18. The method of claim 17, wherein the heating comprises a time period of about 2 minutes or less.

19. The method of claim 16, wherein the substrate is positioned below and proximate the absorptive plate for cooling.

20. The method of claim 19, wherein the cooling comprises a time period of about 10 seconds or less.

21. The method of claim 14, wherein the process gas is directed through a plurality of openings on a surface of the absorptive plate.

22. The method of claim 21, wherein the openings are positioned to evenly distribute gas across the radial surface of the substrate to enhance thermal coupling between the substrate and an absorptive layer of the absorptive plate during cooling.

23. The method of claim 21, wherein the openings are positioned to distribute gas across the radial surface of the substrate in a controlled uneven distribution.

24. The method of claim 14, wherein the thermal processing is a spike annealing process to form a film on the substrate.

* * * * *